(12) United States Patent
Park et al.

(10) Patent No.: US 11,410,596 B2
(45) Date of Patent: Aug. 9, 2022

(54) DISPLAY DEVICE PREVENTING A FLOW OF STATIC ELECTRICITY

(71) Applicant: SAMSUNG DISPLAY CO., LTD., Yongin-si (KR)

(72) Inventors: Hyung Jun Park, Seongnam-si (KR); Seong Young Lee, Hwaseong-si (KR); Kyung Ho Kim, Seongnam-si (KR); Hwan Young Jang, Daegu (KR); Ki Won Park, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 15/622,597

(22) Filed: Jun. 14, 2017

(65) Prior Publication Data

US 2017/0372653 A1 Dec. 28, 2017

(30) Foreign Application Priority Data

Jun. 22, 2016 (KR) .................. 10-2016-0078003

(51) Int. Cl.
*G09G 3/20* (2006.01)
*H01L 27/02* (2006.01)

(52) U.S. Cl.
CPC ....... *G09G 3/2092* (2013.01); *H01L 27/0292* (2013.01); *H01L 27/0296* (2013.01); *G09G 3/20* (2013.01); *G09G 2300/0426* (2013.01); *G09G 2310/0267* (2013.01); *G09G 2330/04* (2013.01); *G09G 2330/06* (2013.01)

(58) Field of Classification Search
CPC ............... G09G 3/2092; G09G 3/3655; G09G 2330/04; G09G 2330/08; G09G 2330/12; G09G 2300/0421; G09G 2300/0426; G09G 2310/0267; G02F 1/1345; G02F 1/1309; G02F 1/136204; G02F 2001/136218; G02F 2202/22; H05F 1/00
USPC .......................................... 349/40, 149, 54
See application file for complete search history.

(56) References Cited

U.S. PATENT DOCUMENTS 7,710,529 B2 * 5/2010 Park ...................... G02F 1/1339
349/139
7,969,537 B2 * 6/2011 Pan ................... G02F 1/136204
349/110
8,310,609 B2 11/2012 Yoshida et al.
(Continued)

FOREIGN PATENT DOCUMENTS

CN 101424828 5/2009
CN 101630078 1/2010
(Continued)

OTHER PUBLICATIONS

Chinese Office Action dated Apr. 27, 2021, issued in corresponding Chinese Patent Application No. 201710479909.3.

*Primary Examiner* — Roberto W Flores
(74) *Attorney, Agent, or Firm* — F. Chau & Associates, LLC

(57) ABSTRACT

Disclosed is a display device, including a first substrate and a second substrate facing the first substrate. A first electrode is positioned on a first surface of the first substrate facing the second substrate. A second electrode is positioned along a border of the second substrate facing the first substrate. The second electrode faces the first electrode. One or more short electrodes electrically connect the first electrode and the second electrode.

23 Claims, 10 Drawing Sheets

(56) References Cited

U.S. PATENT DOCUMENTS

| | | | | |
|---|---|---|---|---|
| 2007/0268442 | A1* | 11/2007 | Oh | G02F 1/136204 349/149 |
| 2009/0079917 | A1* | 3/2009 | Pan | G02F 1/136204 349/110 |
| 2009/0109134 | A1* | 4/2009 | Kim | G02F 1/136204 345/55 |
| 2010/0039354 | A1* | 2/2010 | Sakamoto | G02F 1/167 345/55 |
| 2010/0123846 | A1* | 5/2010 | Kim | G02F 1/1345 349/46 |
| 2010/0163880 | A1* | 7/2010 | Jeon | G02F 1/136204 257/59 |
| 2011/0095290 | A1* | 4/2011 | Koo | G02F 1/1309 257/48 |
| 2011/0187949 | A1* | 8/2011 | Chang | G02F 1/1333 349/33 |
| 2011/0194062 | A1* | 8/2011 | Lee | G02F 1/1339 349/149 |
| 2011/0221734 | A1* | 9/2011 | Umezaki | G09G 3/006 345/211 |
| 2013/0038830 | A1* | 2/2013 | Sato | G02F 1/134363 349/149 |
| 2013/0093706 | A1* | 4/2013 | Kurasawa | G09G 3/2074 345/173 |
| 2013/0242215 | A1* | 9/2013 | Chang | G02F 1/136204 349/41 |
| 2013/0258263 | A1* | 10/2013 | Yasukawa | G02F 1/134309 349/138 |
| 2014/0375919 | A1* | 12/2014 | Segawa | G02F 1/13452 349/40 |
| 2015/0070622 | A1 | 3/2015 | Christophy et al. | |
| 2016/0161776 | A1* | 6/2016 | Wang | G02F 1/1339 349/43 |

FOREIGN PATENT DOCUMENTS

| | | |
|---|---|---|
| CN | 101676776 | 3/2010 |
| CN | 101713883 | 5/2010 |
| JP | 10-091086 | 4/1998 |
| KR | 1020070091724 | 9/2007 |
| KR | 1020100055709 | 5/2010 |
| KR | 101306860 | 9/2013 |
| KR | 1020140032762 | 3/2014 |

* cited by examiner

DISPLAY DEVICE PREVENTING A FLOW OF STATIC ELECTRICITY

CROSS-REFERENCE TO RELATED APPLICATION

This application claims priority to Korean Patent Application No. 10-2016-0078003 filed in the Korean Intellectual Property Office on Jun. 22, 2016, the disclosure of which is incorporated by reference herein in its entirety.

(a) Technical Field

Exemplary embodiments of the present invention relate to a display device, and more particularly to a display device preventing a flow of static electricity.

(b) Discussion of Related Art

A display device may include a display panel, in which a plurality of pixels and wires are disposed on an insulating substrate. The display panel may include a display area, in which the plurality of pixels is positioned and an image is displayed, and a peripheral area, in which a pad and the wires for supplying power to the display area are positioned.

The plurality of pixels, and the pad and the wires for supplying power may be formed on the insulating substrate, and thus momentarily generated static electricity might be dispersed to the outside of the insulating substrate. The static electricity may flow into the display area through the wires positioned in the peripheral area and damage an insulating layer. As an example, the display panel may be vulnerable to static electricity, and the static electricity may damage the display panel.

SUMMARY

A display device according to an exemplary embodiment of the present invention may prevent a flow of static electricity into the display device.

An exemplary embodiment of the present invention provides a display device, including a first substrate and a second substrate facing the first substrate. A first electrode is positioned on a first surface of the first substrate facing the second substrate. A second electrode is positioned along a border of the second substrate facing the first substrate. The second electrode faces the first electrode. One or more short electrodes electrically connect the first electrode and the second electrode.

An outermost portion of the first electrode may overlap an outermost portion of the second electrode.

An outermost portion of the first electrode may overlap an outermost portion of the first substrate.

The display device may include a common voltage wire positioned on the second substrate, and the one or more short electrodes may be connected to the common voltage wire.

The display device may include one or more driving circuit units connected to a pad area adjacent to a first side of the second substrate. The common voltage wire may be connected to the one or more driving circuit units.

The one or more short electrodes may include a first short electrode. The first short electrode may electrically connect the common voltage wire and the second electrode. The one or more short electrodes may include a second short electrode. The second short electrode might not electrically connect the common voltage wire and the second electrode.

The common voltage wire may face the first substrate and may be spaced apart from the second electrode above an upper surface of the second substrate. One or more short electrodes may be adjacent to a first side of the second substrate and a third side of the second substrate facing the first side.

The one or more short electrodes may be adjacent to a second side of the second substrate and a fourth side of the second substrate facing the third side.

The display device may include a power voltage line positioned on the second substrate, and connected to the one or more driving circuit units. A third electrode may be positioned on the second substrate and may face the first electrode. The third electrode may be connected to the power voltage line.

The display device may include: a plurality of pixels. A gate circuit unit may be positioned on the second substrate. The gate circuit may be configured to apply a gate signal to the plurality of pixels. The power voltage line may be connected to the gate circuit unit.

A low level power voltage for driving the gate circuit unit may be applied to the power voltage line.

The third electrode may be positioned between the second electrode and the gate circuit unit.

The display device may include a connection unit directly connecting the second electrode and the common voltage wire.

An exemplary embodiment of the present invention provides a display device, including a common voltage wire and a driving circuit unit connected to the common voltage wire. The driving circuit unit is configured to apply a predetermined level of common voltage. A first electrode connected to the common voltage wire. A second electrode is connected to the common voltage wire and faces the first electrode. The first electrode is positioned on substantially an entire surface facing the second electrode. The second electrode is positioned on a border of a surface facing the first electrode.

The display device may include a first substrate. The first electrode is positioned on the first substrate. An outermost portion of the first electrode may overlap an outermost portion of the first substrate.

An outermost portion of the first electrode may overlap an outermost portion of the second electrode.

The display device may include one or more short electrodes connecting the common voltage wire and the first electrode.

The one or more short electrodes may connect the common voltage wire and the second electrode.

The display device may include a connection unit directly connecting the common voltage wire and the second electrode.

The display device may include a plurality of pixels. A gate circuit unit may be configured to apply a gate signal to the plurality of pixels. A power voltage line may be connected to the driving circuit unit and the gate circuit unit. A third electrode may be connected to the power voltage line and may face the first electrode. The third electrode may be positioned between the second electrode and the gate circuit unit.

According to an exemplary embodiment of the present invention, a flow of static electricity into the display device may be reduced or eliminated, thus reducing or eliminating a defect of the display device.

BRIEF DESCRIPTION OF THE DRAWINGS

The above and other features of the invention will become more apparent by describing in detail exemplary embodiments thereof, with reference to the accompanying, in which.

DETAILED DESCRIPTION

Figure 1:
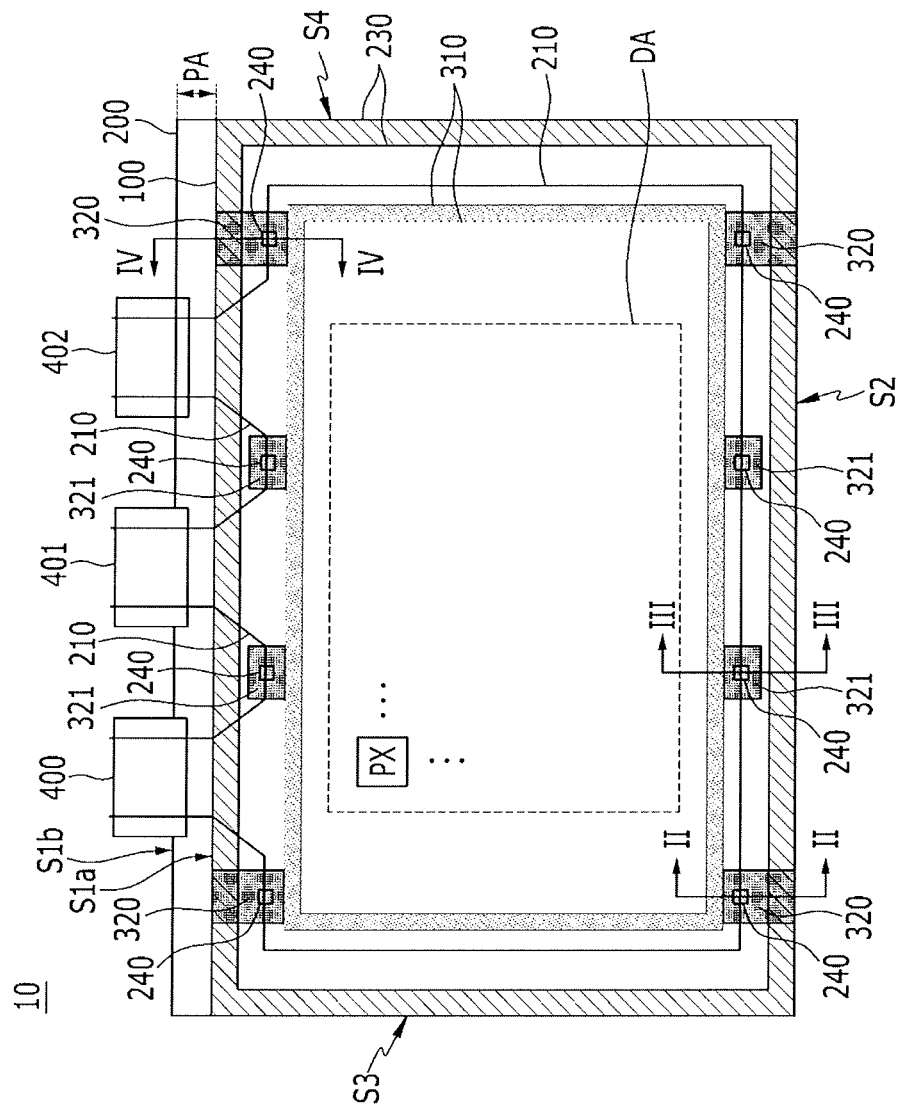
FIG. 1 is a top plan view schematically illustrating a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

Sizes of elements in the drawings may be exaggerated for clarity of description.

It will be understood that when a component, such as a layer, a film, a region, or a plate, is referred to as being "on" another component, the component may be directly on the other component or intervening components may be present.

When it is referred that elements "overlap", this may refer to when the elements vertically overlap in a cross-section.

A display device according to an exemplary embodiment of the present invention will be described in more detail below with reference to FIGS. 1 to 5.

Figure 2:
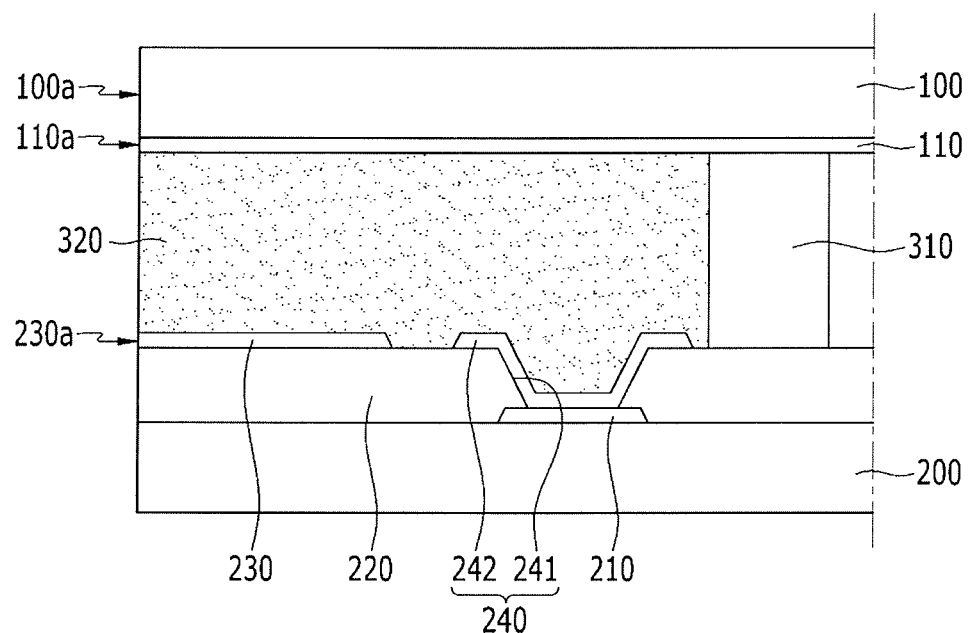
FIG. 2 is a cross-sectional view of the display device taken along line II-II of FIG. 1.
Figure 3:
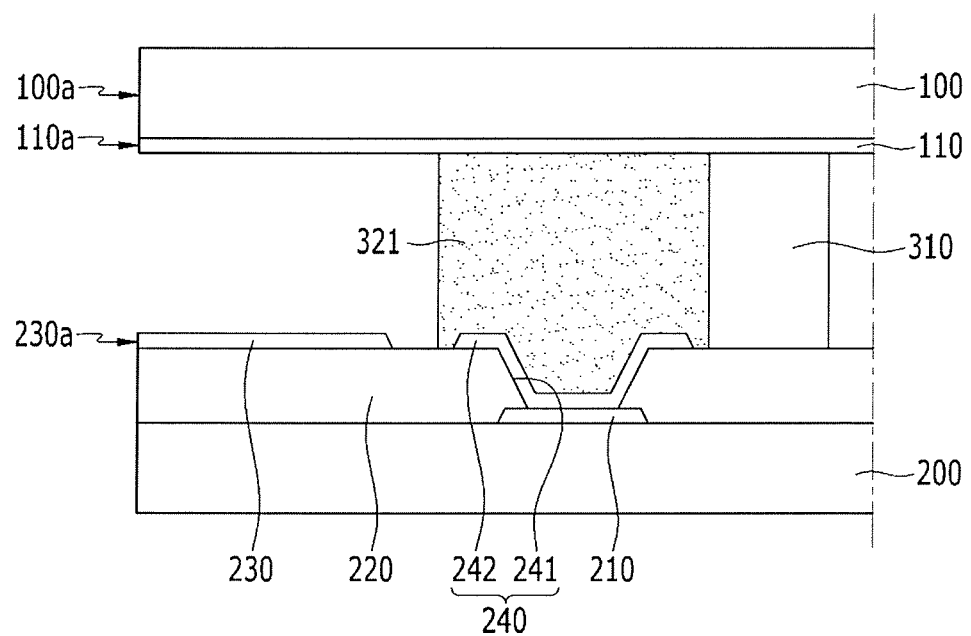
FIG. 3 is a cross-sectional view of the display device taken along line III-Ill of FIG. 1.
Figure 4:
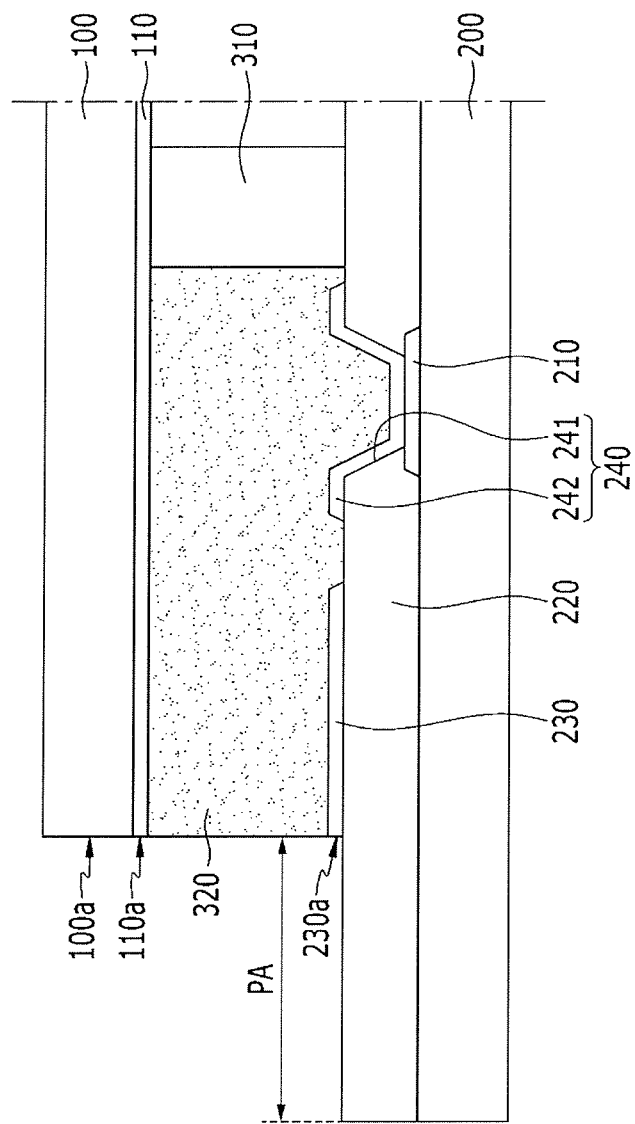
FIG. 4 is a cross-sectional view of the display device taken along line IV-IV of FIG. 1.
Figure 5:
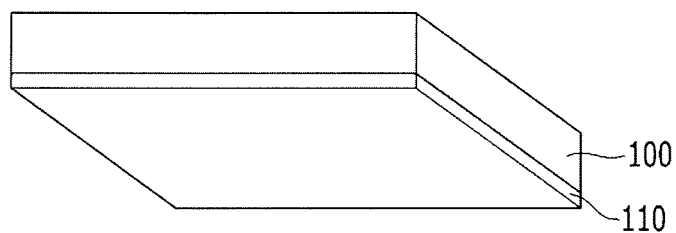
FIG. 5 is a perspective view illustrating a first substrate and a first electrode of the display device according to the exemplary embodiment of FIG. 1.

FIG. 1 is a top plan view schematically illustrating a display device according to an exemplary embodiment of the present invention. FIG. 2 is a cross-sectional view of the display device taken along line II-II of FIG. 1. FIG. 3 is a cross-sectional view of the display device taken along line III-Ill of FIG. 1. FIG. 4 is a cross-sectional view of the display device taken along line IV-IV of FIG. 1. FIG. 5 is a perspective view illustrating a first substrate and a first electrode of the display device according to the exemplary embodiment of FIG. 1.

Referring to FIGS. 1 to 5, a display device 10 may include a first substrate 100, a second substrate 200, a first electrode 110, a second electrode 230, short electrodes 320 and 321, and driving circuit units 400, 401, and 402.

The first substrate 100 and the second substrate 200 may face each other. The first substrate 100 and the second substrate 200 may overlap each other when viewed in a cross-sectional view. The first substrate 100 may be an upper substrate, and the second substrate 200 may be a lower substrate. The first substrate 100 and the second substrate 200 may each be substantially transparent insulators. Each of the first substrate 100 and the second substrate 200 may include glass or plastic.

The first substrate 100 may include four sides S1a, S2, S3, and S4. The second substrate 200 may include four sides S1b, S2, S3, and S4. First sides S1a and S1b may face a second side S2, and a third side S3 may faces a fourth side S4. Three sides S2, S3, and S4 of the first substrate 100 may overlap three sides S2, S3, and S4 of the second substrate 200 corresponding to the sides S2, S3, and S4 of the first substrate 100. The third side S3 and the fourth side S4 of the second substrate 200 may be longer than the third side S3 and the fourth side S4 of the first substrate 100. Thus, the first side S1b of the second substrate 200 may protrude more than the first side S1a of the first substrate 100. Thus, the second substrate 200 may be wider than that of the first substrate 100. An area of the second substrate 200 adjacent to the first side S1b of the second substrate 200 (e.g., the portion of the second substrate 200 that is wider than the first substrate 100), may be a pad area PA. The pad area may be connected to the driving circuit units 400, 401, and 402. As an example, the first substrate 100 includes only an area overlapping the second substrate 200 in a plan view, but the second substrate 200 may further include the pad area PA which does not overlap (e.g., extends beyond) the first substrate 100 in a plan view.

The first electrode 110 may be positioned under the first substrate 100. The first electrode 110 may be in direct contact with a bottom surface of the first substrate 100. Referring to FIG. 5, the first electrode 110 may be positioned on a front surface of the first substrate 100 facing the second substrate 200. An outermost portion 110a of the first electrode 110 may overlap an outermost portion 100a of the first substrate 100. The first electrode 110 may include a transparent conductor, such as an indium tin oxide (ITO) or an indium zinc oxide (IZO).

The second electrode 230 may be positioned on or above the second substrate 200. An insulating layer 220 may be disposed between the second electrode 230 and the second substrate 200. The second electrode 230 may be positioned along a boundary of the second substrate 200 facing the first substrate 100 and may face the first electrode 110. As an example, the second electrode 230 might not be positioned within the pad area PA. An outermost edge of the second electrode 230 may substantially completely overlap an outer edge of the first substrate 100 without overlapping the pad area PA. As an example, an outermost portion 230a of the second electrode 230 and the outermost portion 110a of the first electrode 110 may overlap each other in a plan view. The second electrode 230 may include a transparent conductor, such as an ITO or an IZO. According to an exemplary embodiment of the present invention, the second electrode 230 may include a conductor including a metal material.

A sealant 310, which may bond the first substrate 100 to the second substrate 200, may be positioned on the second electrode 230. The sealant 310 may extend along the second electrode 230. The sealant 310 may seal an internal portion of a space between the first substrate 100 and the second substrate 200. The sealant 310 may include an insulator, in which electricity does not flow. According to an exemplary embodiment of the present invention, the sealant 310 may include a conductor, in which electricity flows.

A plurality of pixels PX may be positioned within an area surrounded by the sealant 310. Each of the plurality of pixels PX may include one or more transistors positioned on the second substrate 200, and a pixel electrode. The plurality of pixels PX may be approximately arranged in a matrix form. An area, in which the plurality of pixels is positioned, may be referred to as a display area DA.

The driving circuit units 400, 401, and 402 may each be connected to the pad area PA of the second substrate 200, and may each be connected to common voltage wires 210 positioned in the second substrate 200 in the pad area PA. A predetermined level of common voltage may be applied to the common voltage wire 210. The common voltage may be a reference voltage for displaying a grayscale of the pixel PX. For example, the common voltage may be a voltage having substantially a same level as that of a data voltage having a gray of 0.

The driving circuit units 400, 401, and 402 may each include a flexible printed circuit (FPC), and may each be connected to the pad area PA of the second substrate 200 by an anisotropic conductive film (ACF). Referring to FIG. 1, according to an exemplary embodiment of the present invention, the number of driving circuit units 400, 401, and 402 may be three; however, exemplary embodiments of the present invention are not limited thereto. As an example, one or two or more driving circuit units 400, 401, and 402 may also be provided.

When viewed in a plan view (see, e.g., FIG. 1), the common voltage wire 210 may be generally extended along the border of the second substrate 200. For example, the common voltage wire 210 may be extended along the second to fourth sides S2 to S4 of the second substrate 200 while being adjacent to the second electrode 230. In this case, the common voltage wire 210 may be positioned between the second electrode 230 and the sealant 310. The common voltage wire 210 extended along the third side S3 may be extended to the first driving circuit unit 400 positioned relatively closest to the third side S3. The common voltage wire 210 extended along the fourth side S4 may be extended to the third driving circuit unit 402 positioned closest to the fourth side S4. The common voltage wires 210 extended to the first driving circuit unit 400 and the third driving circuit unit 402 may cross the second electrode 230, but the common voltage wire 210 may be insulated from the second electrode 230 by the insulating layer 220 in the crossing portion.

The common voltage wire 210 connected to the second driving circuit unit 401, which is not adjacent to the third side S3 or the fourth side S4 may be connected to the adjacent first driving circuit unit 400 or second driving circuit unit 401. In this case, a part of the common voltage wire 210 may be extended in a direction of the first side S1$b$ between the second electrode 230 and the sealant 310.

The short electrodes 320 and 321 may each be positioned between the first substrate 100 and the second substrate 200, and the common voltage wire 210 and the first electrode 110 may be connected to each other through the short electrodes 320 and 321. The short electrodes 320 and 321 may each include an anisotropic conductor, which is capable of electrically connecting the common voltage wire 210 and the first electrode 110.

The short electrodes 320 and 321 may include a first short electrode 320 and a second short electrode 321. The first short electrode 320 and the second short electrode 321 may each be positioned in the first side S1$a$ and the second side S2 of the first substrate 100. For example, the first short electrodes 320 may be positioned in a portion adjacent to a corner in the first side S1$a$ of the first substrate 100 and a portion adjacent to a corner in the second side S2 of the first substrate 100. The second short electrodes 321 may be positioned in the first side S1$a$ and the second side S2 of the first substrate 100. The second short electrode 321 positioned in the first side S1$a$ of the first substrate 100 may be positioned between the driving circuit units 400, 401, and 402. The second short electrode 321 positioned in the second side S2 may face the second short electrode 321 positioned in the first side S1$a$.

According to an exemplary embodiment of the present invention, the positions of the first short electrode 320 and the second short electrode 321 may be variously changed, and the positions of the first short electrode 320 and the second short electrode 321 are not limited to particular positions.

The first short electrode 320 positioned at the second side S2 of the first substrate 100 will be described in more detail below with reference to FIG. 2.

Referring to FIG. 2, the common voltage wire 210 may be disposed on the second substrate 200, and the insulating layer 220 and the second electrode 230 may be disposed on the common voltage wire 210. The common voltage wire 210 may be in direct contact with an upper surface of the second substrate 200. The insulating layer 220 may be positioned between the common voltage wire 210 and the second electrode 230. The insulating layer 220 may include an inorganic insulating material or an organic insulating material. The insulating layer 220 may have a single-layer structure or may have a multi-layer structure including multiple different insulating materials.

The first short electrode 320 may be electrically connected with the common voltage wire 210 through a short circuit unit 240. The short circuit unit 240 may include a first contact hole 241 exposing the common voltage wire 210, and a pad electrode 242 which is in direct contact with the common voltage wire 210 through the first contact hole 241. The first contact hole 241 may be formed in the insulating layer 220. The pad electrode 242 may be separated from the second electrode 230. The common voltage wire 210 may include a conductor including a metal material. The pad electrode 242 may include a conductor including a same material as that of the second electrode 230.

The first short electrode 320 may be positioned on the common voltage wire 210 and the second electrode 230. As an example, the first short electrode 320 may overlap the common voltage wire 210 and the second electrode 230. The first short electrode 320 may be electrically connected with the common voltage wire 210 through the short circuit unit 240, and may be directly connected with the second electrode 230 to electrically connect the common voltage wire 210 and the second electrode 230. The first short electrode 320 may be directly connected with the first electrode 110 of the first substrate 100 to electrically connect the first electrode 110 and the second electrode 230.

According to an exemplary embodiment of the present invention, the short circuit unit 240 may include the pad electrode 242; however, exemplary embodiments of the present invention are not limited thereto. For example, the pad electrode 242 may be omitted, and the first short electrode 320 may be directly connected to the common voltage wire 210 through the first contact hole 241. The pad electrode 242 included in the short circuit unit 240 might not be separated from the second electrode 230, but may be directly connected to the second electrode 230. As an example, the pad electrode 242 of the short circuit unit 240 may be integrated with the second electrode 230. According to an exemplary embodiment of the present invention, one short circuit unit 240 may be provided for each first short electrode 320; however, exemplary embodiments of the present invention are not limited thereto. For example, a plurality of short circuit units 240 may be provided for each first short electrode 320 to electrically connect the common voltage wire 210 and the first short electrode 320. According to an exemplary embodiment of the present invention, the short circuit unit 240 may be connected to the second short electrode 321 described with reference to FIG. 3 and to the first short electrode 320 described with reference to FIG. 4.

The second short electrode 321 will be described in more detail below with reference to FIG. 3.

Referring to FIG. 3, the second short electrode 321 may be electrically connected with the common voltage wire 210 through the short circuit unit 240. The second short electrode 321 is positioned above the common voltage wire 210, and might not be in direct contact with on the second electrode 230. As an example, the second short electrode 321 may overlap the common voltage wire 210 when viewed in a cross-section and might not overlap the second electrode 230. The common voltage wire 210 and the second electrode 230 might not be electrically connected through the second short electrode 321. The second short electrode 321 may be directly connected with the first electrode 110 of the first substrate 100 to electrically connect the first electrode 110 and the common voltage wire 210. According to an exemplary embodiment of the present invention, the first electrode 110 and the second electrode 230 might not be directly connected through the second short electrode 321.

The first short electrode 320 will be described in more detail below with reference to FIG. 4.

According to an exemplary embodiment of the present invention, the first short electrode 320 may be positioned at the first side S1a of the first substrate 100.

Referring to FIG. 4, the second substrate 200 may be expanded by the pad area PA with respect to the first substrate 100. The insulating layer 220 may be positioned in the pad area PA, but the second electrode 230 might not be positioned in the pad area PA. As an example, the outermost portion 230a of the second electrode 230 may overlap the outermost portion 110a of the first electrode 110. As an example, the first short electrode 320 might not be positioned in the pad area PA.

The first electrode 110 may be disposed on the first substrate 100 such that the outermost portion 110a of the first electrode 110 overlaps the outermost portion 100a of the first substrate 100. The second electrode 230 may be positioned above the second substrate 200 such that the outermost portion 230a of the second electrode 230 overlaps the outermost portion 110a of the first electrode 110. Thus the second electrode 230 may face the first electrode 110. Thus, static electricity generated in an external surface of the first substrate 100 may flow to the first electrode 110 along the external surface of the first substrate 100. Static electricity having a characteristic of being easily discharged in a sharp structure or an angulate structure may be discharged in the outermost portion 110a of the first electrode 110 and flow to the second electrode 230. The static electricity may be discharged to the first driving circuit unit 400 and the third driving circuit unit 402 through the first short electrode 320 and the common voltage wire 210. Static electricity, which is not discharged from the outermost portion 110a of the first electrode 110 to the second electrode 230, may be discharged to the first driving circuit unit 400 and the third driving circuit unit 402 through the first short electrode 320, the second short electrode 321, and the common voltage wire 210.

The driving circuit units 400, 401, and 402 may be connected to a power management integrated circuit (PMIC), which generates a predetermined level of common voltage applied to the common voltage wire 210, and the static electricity discharged to the PMIC through the driving circuit units 400, 401, and 402 may be offset in the PMIC.

The static electricity generated at the outside of the display device 10 may move to the driving circuit units 400, 401, and 402 around the display area DA by the first electrode 110, the second electrode 230, the short electrodes 320 and 321, and the common voltage wire 210 positioned outside the sealant 310. Thus, the static electricity generated at the outside of the display device 10 might not move to the display area DA surrounded by the sealant 310.

The features and characteristics of the display device according to an exemplary embodiment of the present invention described with reference to FIGS. 1 to 5 may be applied to the display device according to an exemplary embodiment of the present invention described with reference to FIG. 6, and thus duplicative descriptions may be omitted A display device according to an exemplary embodiment of the present invention will be described below with reference to FIG. 6. The display device described with reference to FIG. 6 will be described based on differences from the display device described with reference to FIGS. 1 to 5.

Figure 6:
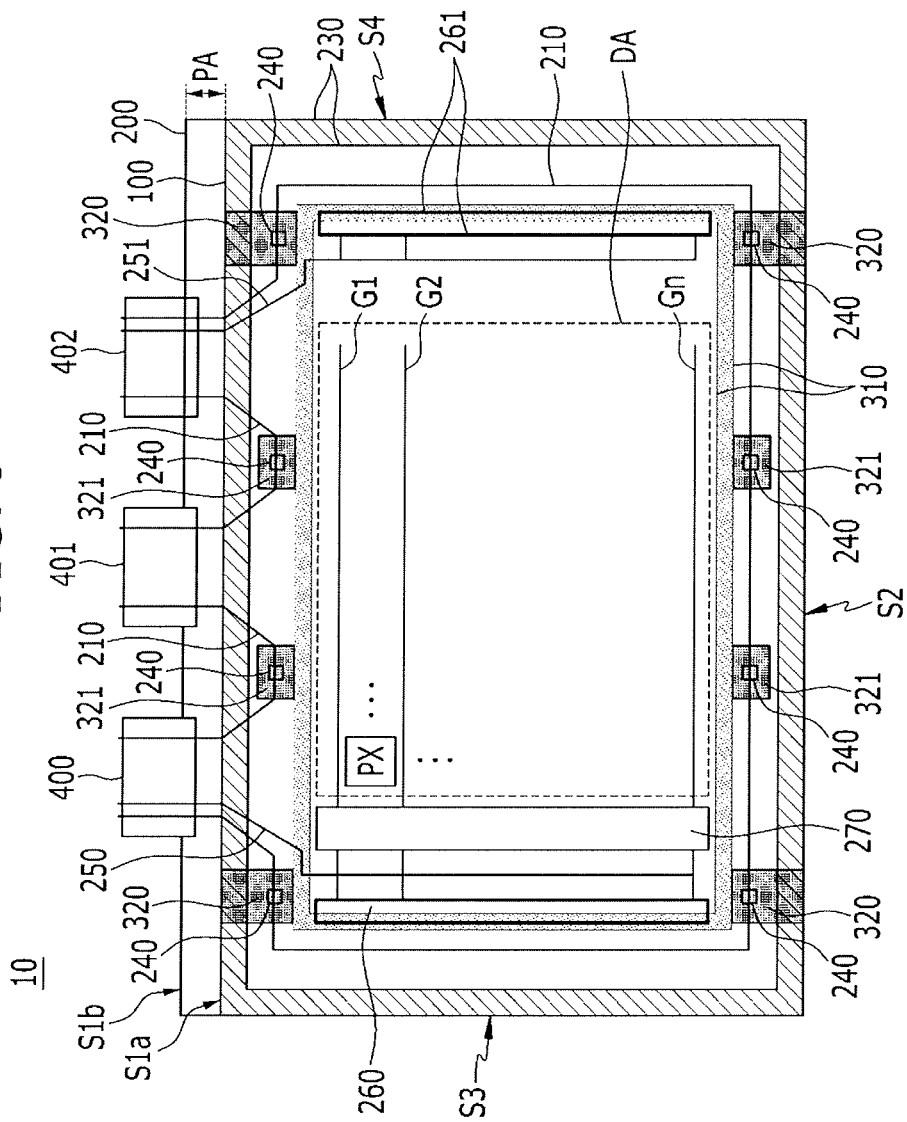
FIG. 6 is a top plan view schematically illustrating a display device according to an exemplary embodiment of the present invention.

FIG. 6 is a top plan view schematically illustrating a display device according to an exemplary embodiment of the present invention.

Referring to FIG. 6, the display device 10 may include a third electrode 260 and a fourth electrode 261, which are each positioned on the second substrate 200 and face a first electrode 110.

The third electrode 260 may be connected to a first power voltage line 250 connected to a first driving circuit unit 400. The first power voltage line 250 may be connected to a gate circuit unit 270, which is positioned on the second substrate 200 and may apply a gate signal to a plurality of pixels PX.

The gate circuit unit 270 may be extended in a direction substantially parallel to a third side S3 of the second substrate 200 while being adjacent to a display area DA surrounded by a sealant 310. The gate circuit unit 270 may be connected to a plurality of gate lines G1 to Gn connected to the plurality of pixels PX positioned in the display area DA. The plurality of gate lines G1 to Gn may be extended in a direction substantially parallel to a first side S1b of the second substrate 200 from the gate circuit unit 270 and may each be connected to the plurality of pixels PX. The gate circuit unit 270 may generate a gate signal formed of a combination of a gate on voltage and a gate off voltage, and may apply the gate signal to the plurality of pixels PX through the plurality of gate lines G1 to Gn.

The third electrode 260 may be extended in a direction approximately parallel to the gate circuit unit 270 while being adjacent to the gate circuit unit 270, and may be positioned between the second electrode 230 and the gate circuit unit 270. The third electrode 260 may partially overlap a portion of the sealant 310 adjacent to a third side S3 in a plan view. The third electrode 260 may be positioned along the portion of the sealant 310 adjacent to the third side S3 such that it's position does not deviate from an area surrounded by the sealant 310.

The first power voltage line 250 may be connected to the first driving circuit unit 400, which is closest to the third side S3 in the pad area PA, and may be extended in a direction substantially parallel to the third side S3 between the third electrode 260 and the gate circuit unit 270. The first power voltage line 250 may be connected to the third electrode 260 and the gate circuit unit 270. A first power voltage for generating a gate signal may be applied to the first power voltage line 250. A relatively high level power voltage and a relatively low level power voltage may be applied to the gate circuit unit 270 for generating a gate signal, and the first power voltage applied to the first power voltage line 250 may be a relatively low level power voltage. As an example, a relatively low level power voltage for driving the gate circuit unit 270 may be applied to the first power voltage line 250. The relatively low level power voltage applied to the first power voltage line 250 may be a different level of voltage from that of a common voltage applied to the second electrode 230.

The first electrode 110 and the third electrode 260 may form one electrostatic capacitor with the sealant 310 disposed therebetween. Static electricity generated outside the display device 10 may be prevented from flowing to the gate circuit unit 270 by the electrostatic capacitor.

The fourth electrode 261 may be connected to the second power voltage line 251, which is connected to the third driving circuit unit 402 closest to the fourth side S4. The fourth electrode 261 may partially overlap a portion of the sealant 310 adjacent to the fourth side S4 in a plan view. The fourth electrode 261 may be positioned along the portion of the sealant 310 adjacent to the fourth side S4 such that its position does deviate from an area surrounded by the sealant 310. The fourth electrode 261 may face the third electrode 260 with the display area DA disposed therebetween.

The second power voltage line 251 may be connected to the third driving circuit unit 402, which is closest to the fourth side S4 in the display area PA, and may be extended in a direction substantially parallel to the fourth side S4 while being adjacent to the fourth electrode 261. A relatively low level power voltage for driving the gate circuit unit 270 may be applied to the second power voltage line 251.

The first electrode 110 and the fourth electrode 261 may form a second electrostatic capacitor with the sealant 310 disposed therebetween. Static electricity generated outside the display device 10 may be prevented from flowing to the display area DA surrounded by the sealant 310 by the second electrostatic capacitor.

The gate circuit unit 270 may be positioned only at the third side S3; however, exemplary embodiments of the present invention are not limited thereto. According to an exemplary embodiment of the present invention, another gate circuit unit may be additionally positioned at the fourth side S4 while being adjacent to the fourth electrode 261. In this case, the second power voltage line 251 may be positioned between another gate circuit unit and the fourth electrode 261, and may be connected to another gate circuit unit and the fourth electrode 261.

The features and characteristics of the display device according to an exemplary embodiment of the present invention described with reference to FIGS. 1 to 5 may be applied to the display device according to an exemplary embodiment of the present invention described with reference to FIGS. 7 and 8, and thus duplicative descriptions may be omitted.

A display device according to an exemplary embodiment of the present invention will be described below with reference to FIGS. 7 and 8. The display device described with reference to FIGS. 7 and 8 will be described based on differences from the display device described with reference to FIGS. 1 to 5.

Figure 7:
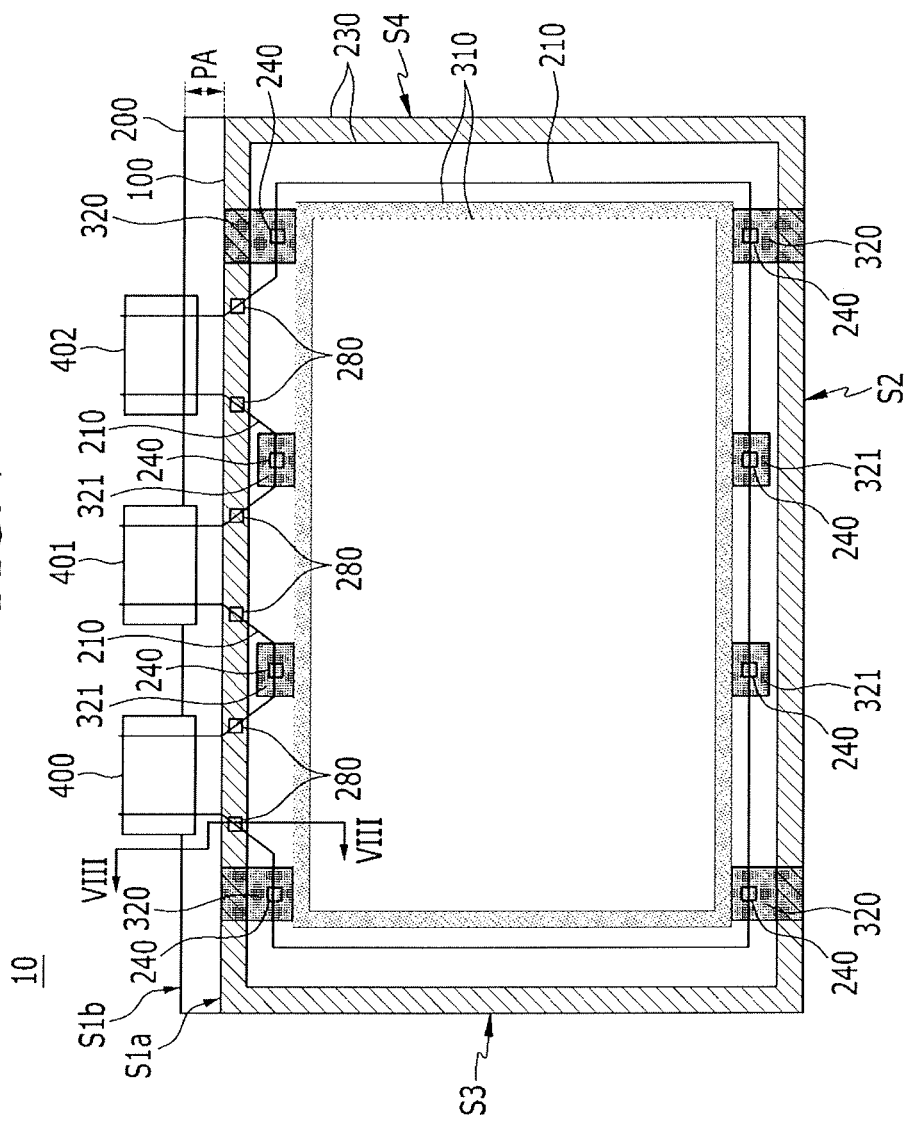
FIG. 7 is a top plan view schematically illustrating a display device according to an exemplary embodiment of the present invention.

FIG. 7 is a top plan view schematically illustrating a display device according to an exemplary embodiment of the present invention. FIG. 8 is a cross-sectional view of the display device taken along line VIII-VIII of FIG. 7.

Figure 8:
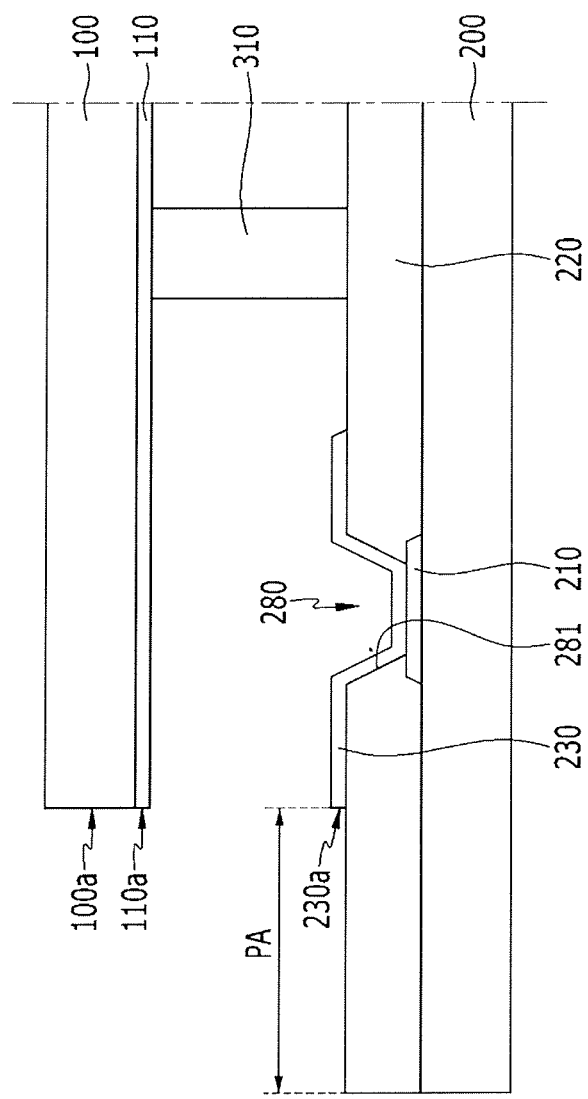
FIG. 8 is a cross-sectional view of the display device taken along line VIII-VIII of FIG. 7.

Referring to FIGS. 7 and 8, the display device 10 may include a connection unit 280. The connection unit 280 may directly connect the second electrode 230 and the common voltage wire 210.

The connection unit 280 may be positioned at a position, at which the second electrode 230 and the common voltage wire 210 overlap. As an example, the connection unit 280 may be positioned at a position, at which the common voltage wire 210 positioned between the second electrode 230 and a sealant 310 is extended to sides of the driving circuit units 400, 401, and 402 and overlaps the second electrode 230. The connection unit 280 may include a second contact hole 281 formed in an insulating layer 220 and exposing the common voltage wire 210. The second electrode 230 may be positioned on the insulating layer 220 and the exposed common voltage wire 210. The second electrode 230 may be in direct contact with the insulating layer 220 and may be in direct contact with the common voltage wire 210. The second electrode 230 may be directly connected to the common voltage wire 210.

As an example, according to the direction connection of the second electrode 230 and the common voltage wire 210, static electricity generated outside the display device 10 may be discharged in the first electrode 110. The static electricity may move to the second electrode 230, and may be discharged to the first driving circuit unit 400 and the third driving circuit unit 402 through the common voltage wire 210. As an example, static electricity may be discharged to the first driving circuit unit 400 and the third driving circuit unit 402 without passing through a first short electrode 320, thus shortening an inflow path of static electricity.

When the second electrode 230 and the common voltage wire 210 are directly connected to the connection unit 280, the first short electrode 320 may be omitted, or a second short electrode 321 may be positioned instead of the first short electrode 320.

The features and characteristics of the display device according to an exemplary embodiment of the present invention described with reference to FIGS. 1 to 5 may be applied to the display device according to an exemplary embodiment of the present invention described with reference to FIGS. 9 and 10, and thus duplicative descriptions may be omitted.

A display device according to an exemplary embodiment of the present invention will be described below with reference to FIGS. 9 and 10. The display device described with reference to FIGS. 9 and 10 will be described based on differences from the display device described with reference to FIGS. 1 to 5.

Figure 9:
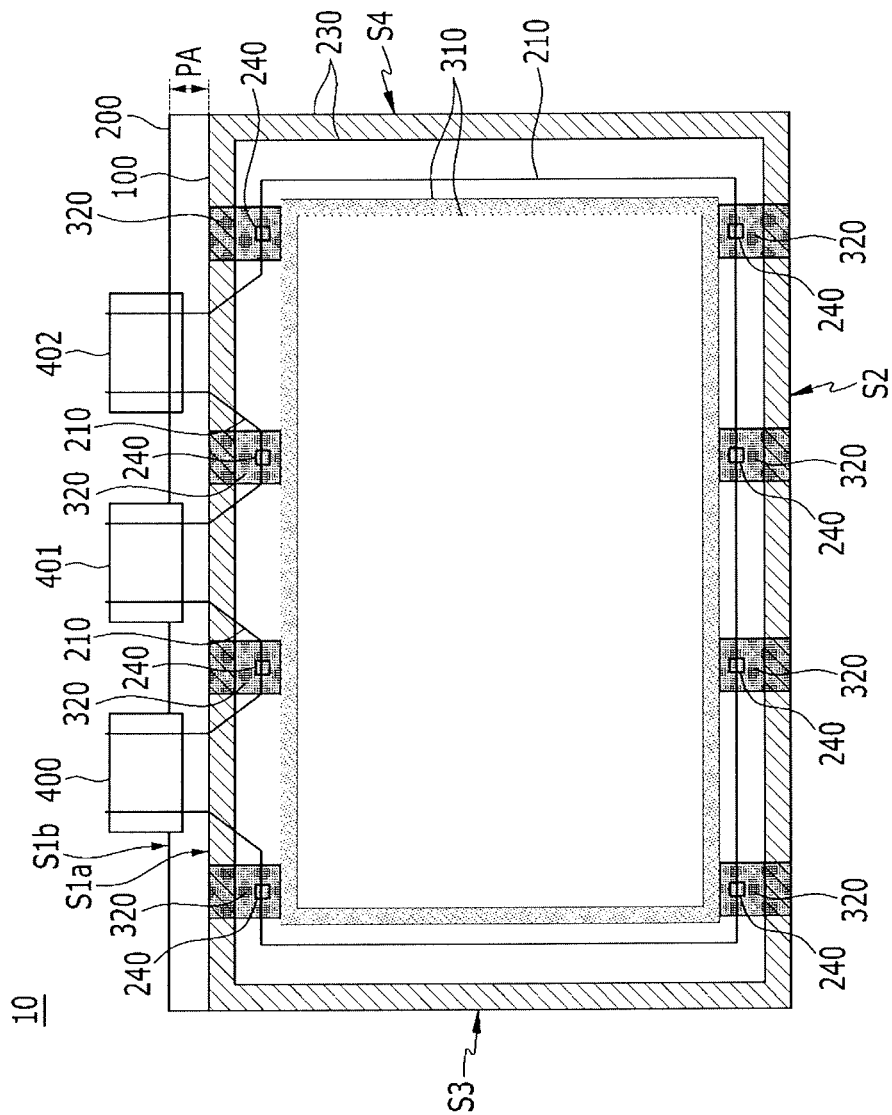
FIG. 9 is a top plan view schematically illustrating a display device according to an exemplary embodiment of the present invention.

FIG. 9 is a top plan view schematically illustrating a display device according to an exemplary embodiment of the present invention.

Referring to FIG. 9, the display device 10 may connect the common voltage wire 210 and the first electrode 110 only with the first short electrode 320. That is, the second short electrode 321 may be omitted.

When the second short electrode 321 is omitted and only the first short electrode 320 connects the common voltage wire 210 and the first electrode 110, an area in which the first electrode 110 and the second electrode 230 are directly connected may be increased such that static electricity may more effectively move (e.g., more static electricity may be discharged with less resistance) from the first electrode 110 to the second electrode 230. Further, static electricity may be discharged through the second driving circuit unit 401, which is not adjacent to a third side S3 or a fourth side S4, as well as the first driving circuit unit 400 most adjacent to the third side S3 and the third driving circuit unit 402 most adjacent to the fourth side S4.

Thus, static electricity generated outside the display device 10 may be more effectively discharged from the first electrode 110 to the driving circuit units 400, 401, and 402.

Figure 10:
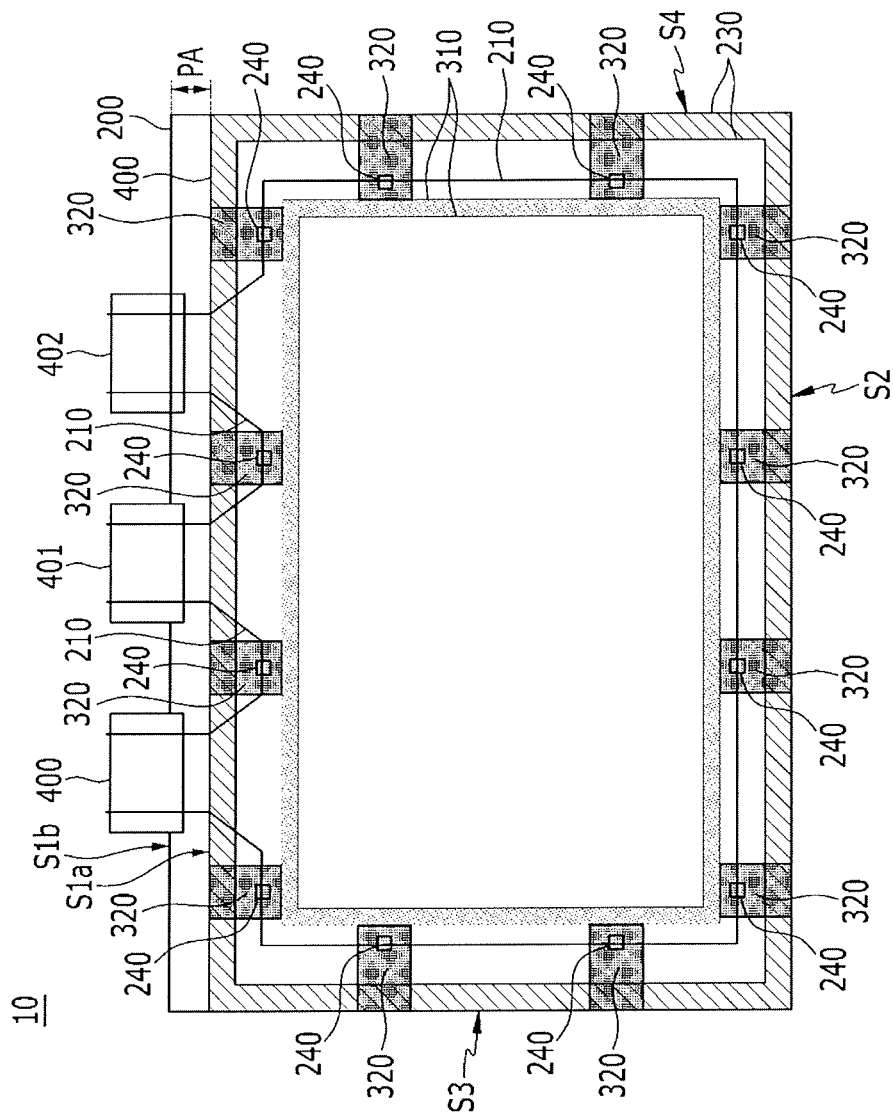
FIG. 10 is a top plan view schematically illustrating a display device according to an exemplary embodiment of the present invention.

FIG. 10 is a top plan view schematically illustrating a display device according to an exemplary embodiment of the present invention.

Referring to FIG. 10, the display device 10 may connect the common voltage wire 210 and the first electrode 110 only with the first short electrode 320. That is, the second short electrode 321 may be omitted. The first short electrode 320 may be positioned at sides of the third side S3 and the fourth side S4, as well as sides of the first side S1a and the second side S2.

The first short electrode 320 may be positioned at the third side S3 and the fourth side S4, such that an area in which the first electrode 110 and the second electrode 230 are directly connected is further increased. Thus, thus static electricity may more effectively move (e.g., more static electricity may be discharged with less resistance) from the first electrode 110 to the second electrode 230.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device, comprising:
a first substrate;
a second substrate facing the first substrate;
a first electrode disposed directly on a bottom surface of the first substrate and positioned on an entire bottom surface of the first substrate facing the second substrate;
a second electrode comprising four portions facing the first electrodes, wherein the four portions of the second electrode are connected to each other as a rectangular shape, three portions among the four portions are respectively disposed on three edges of the second substrate and are respectively positioned along three borders of the second substrate;
a plurality of short electrodes disposed between the first electrode and the second electrode and spaced apart from one another, the plurality of short electrodes electrically connecting the first electrode and the second electrode, wherein the plurality of short electrodes directly contacts a bottom surface of the first electrode; and
a sealant bonding the first substrate and the second substrate,
wherein an outermost side edge of the first electrode overlaps an outermost side edge of the second electrode,
wherein the plurality of short electrodes is disposed outside of the sealant and does not overlap the sealant in a plan view, and
wherein the sealant is solely disposed inside of the second electrode.

2. The display device of claim 1, wherein the outermost side edge of the first electrode facing in a direction perpendicular to an upper surface of the second substrate is aligned with the outermost side edge of the second electrode facing in the direction perpendicular to the upper surface of the second substrate along a direction orthogonal to the upper surface of the second substrate.

3. The display device of claim 2, wherein the outermost side edge of the first electrode facing in the direction perpendicular to the upper surface of the second substrate is aligned with an outermost side edge of the first substrate facing in the direction perpendicular to the upper surface of the second substrate along the direction orthogonal to the upper surface of the second substrate.

4. The display device of claim 1, further comprising:
a common voltage wire positioned on the second substrate,
wherein the plurality of short electrodes are connected to the common voltage wire.

5. The display device of claim 4, further comprising:
one or more driving circuit units connected to a pad area adjacent to a first side of the second substrate,
wherein the common voltage wire is connected to one or more driving circuit units.

6. The display device of claim 5, wherein the plurality of short electrodes includes:
a first short electrode, wherein the first short electrode electrically connects the common voltage wire and the second electrode; and
a second short electrode, wherein the second short electrode does not electrically connect the common voltage wire and the second electrode.

7. The display device of claim 5, wherein the common voltage wire faces the first substrate and is spaced apart from the second electrode above an upper surface of the second substrate, and
the plurality of short electrodes is adjacent to a first side of the second substrate and a third side of the second substrate facing the first side.

8. The display device of claim 7, wherein:
the plurality of short electrodes is adjacent to a second side of the second substrate and a fourth side of the second substrate facing the second side.

9. The display device of claim 5, further comprising:
a power voltage line positioned on the second substrate, and connected to the one or more driving circuit units; and
a third electrode positioned on the second substrate and facing the first electrode, and connected to the power voltage line.

10. The display device of claim 9, further comprising:
a plurality of pixels; and
a gate circuit unit positioned on the second substrate, and configured to apply a gate signal to the plurality of pixels,
wherein the power voltage line is connected to the gate circuit unit.

11. The display device of claim 10, wherein:
a low level power voltage for driving the gate circuit unit is applied to the power voltage line.

12. The display device of claim 10, wherein:
the third electrode is positioned between the second electrode and the gate circuit unit.

13. The display device of claim 5, further comprising:
a connection unit positioned where the second electrode overlaps the common voltage wire and directly connecting the second electrode and the common voltage wire.

14. The display device of claim 1, wherein:
either the second electrode is disposed directly on the second substrate, or an insulating layer is disposed directly on the second substrate and the second electrode is disposed directly on the insulating layer.

15. The display device of claim 1, wherein:
the four portions of the second electrode are connected to each other as the rectangular shape.

16. A display device, comprising:
a first substrate;
a second substrate facing the first substrate;
a common voltage wire disposed on the second substrate;
a driving circuit unit connected to the common voltage wire and configured to apply a predetermined level of common voltage;
a first electrode disposed on the first substrate and connected to the common voltage wire;
a second electrode disposed on the second substrate and connected to the common voltage wire, facing the first electrode, and comprising four portions;
a plurality of short electrodes disposed between the common voltage wire and the first electrode and connecting the common voltage wire and the first electrode, each of the plurality of short electrodes directly contacting a bottom surface of the first electrode; and
a sealant bonding the first substrate and the second substrate,
wherein the first electrode is disposed directly on a bottom surface of a first substrate and is positioned on substantially an entire bottom surface of the first substrate facing the second electrode,
wherein the four portions of the second electrode are connected to each other as a rectangular shape, three portions among the four portions of the second electrode are respectively disposed on three edges of a second substrate and are respectively positioned on three borders of a surface of the second substrate,
wherein an outermost side edge of the first electrode overlaps an outermost side edge of the second electrode,
wherein the plurality of short electrodes is disposed outside of the sealant and does not overlap the sealant in a plan view,
wherein the sealant is solely disposed inside of the second electrode.

17. The display device of claim 16, wherein:
the outermost side edge of the first electrode is aligned with an outermost side edge of the first substrate.

18. The display device of claim 17, wherein:
the outermost side edge of the first electrode facing in a direction perpendicular to an upper surface of the second substrate is aligned with the outermost side edge of the second electrode facing in the direction perpendicular to the upper surface of the second substrate along a direction orthogonal to the upper surface of the second substrate.

19. The display device of claim 16, wherein:
the plurality of short electrodes connects the common voltage wire and the second electrode.

20. The display device of claim 16, further comprising:
a connection unit positioned where the second electrode overlaps the common voltage wire and directly connecting the common voltage wire and the second electrode.

21. The display device of claim 16, further comprising:
a plurality of pixels;
a gate circuit unit configured to apply a gate signal to the plurality of pixels;
a power voltage line connected to the driving circuit unit and the gate circuit unit; and
a third electrode connected to the power voltage line and facing the first electrode,
wherein the third electrode is positioned between the second electrode and the gate circuit unit.

22. The display device of claim 16, wherein:
either the second electrode is disposed directly on the second substrate, or an insulating layer is disposed directly on the second substrate and the second electrode is disposed directly on the insulating layer.

23. The display device of claim 16, wherein:
the four portions of the second electrode are connected to each other as the rectangular shape.

\* \* \* \* \*